(12) United States Patent
Shen

(10) Patent No.: US 7,180,184 B2
(45) Date of Patent: Feb. 20, 2007

(54) CONDUCTIVE BUMP FOR SEMICONDUCTOR DEVICE AND METHOD FOR MAKING THE SAME

(76) Inventor: Yu-Nung Shen, 4F, No. 52, Sec. 2, Chung-Shan N. Rd., Taipei City (TW)

( * ) Notice: Subject to any disclaimer, the term of this patent is extended or adjusted under 35 U.S.C. 154(b) by 0 days.

(21) Appl. No.: 10/716,788

(22) Filed: Nov. 19, 2003

(65) Prior Publication Data

US 2004/0142552 A1    Jul. 22, 2004

(30) Foreign Application Priority Data

Nov. 22, 2002  (TW) .............................. 91134055 A

(51) Int. Cl.
*H01L 23/48* (2006.01)

(52) U.S. Cl. ...................................... 257/737; 257/778

(58) Field of Classification Search ................ 257/780, 257/781, 778, 737; 438/613, 614
See application file for complete search history.

(56) References Cited

U.S. PATENT DOCUMENTS

| 6,159,837 | A  | * | 12/2000 | Yamaji et al. | ............... | 438/613 |
| 6,165,885 | A  | * | 12/2000 | Gaynes et al. | ............. | 438/612 |
| 6,281,107 | B1 | * | 8/2001  | Moriyama | .................. | 438/613 |
| 6,596,560 | B1 | * | 7/2003  | Hsu | .......................... | 438/108 |

* cited by examiner

*Primary Examiner*—Doug Menz

(57) ABSTRACT

A conductive bump is formed on a semiconductor chip having a pad-mounting surface which is provided with at least a bonding pad thereon. The conductive bump includes a first metal layer formed on the bonding pad, a conductive paste body formed on the first metal layer, and a second metal layer formed on the paste body such that the paste body is sandwiched between the first and second metal layers.

2 Claims, 4 Drawing Sheets

CONDUCTIVE BUMP FOR SEMICONDUCTOR DEVICE AND METHOD FOR MAKING THE SAME

CROSS-REFERENCE TO RELATED APPLICATION

This application claims priority of Taiwanese Patent Application No. 091134055, filed on Nov. 22, 2002.

BACKGROUND OF THE INVENTION

1. Field of the Invention

This invention relates to a conductive bump for a semiconductor device, and more particularly to a conductive bump having a paste body sandwiched between first and second metal layers and to a method for making the same.

2. Description of the Related Art

A semiconductor chip with bonding pads is normally provided with conductive bumps thereon for electrical connection to an electronic device. Conventionally, the conductive bumps are made of tin solder. However, tin solder normally contains a significant amount of lead, which is harmful to the environment. Though lead-free tin solder is commercially available, the same still contains a small amount of lead. As a consequence, tin solder has been widely replaced by conductive paste due to environmental concerns. The conductive paste normally contains a thermosetting resin and a conductive filler, such as silver particulate and carbon particulate.

SUMMARY OF THE INVENTION

Therefore, the object of the present invention is to provide a conductive bump for a semiconductor chip that is capable of overcoming the aforesaid drawback of the prior art.

Another object of the present invention is to provide a method for making a conductive bump on a semiconductor chip.

According to the present invention, there is provided a conductive bump for a semiconductor chip that has a pad-mounting surface which is provided with at least a bonding pad thereon. The conductive bump comprises: a first metal layer adapted to be bonded to the bonding pad; a conductive paste body formed on the first metal layer; and a second metal layer formed on the paste body such that the paste body is sandwiched between the first and second metal layers.

BRIEF DESCRIPTION OF THE DRAWINGS

In drawings which illustrate embodiments of the invention.

DETAILED DESCRIPTION OF THE PREFERRED EMBODIMENTS

Figure 1A:
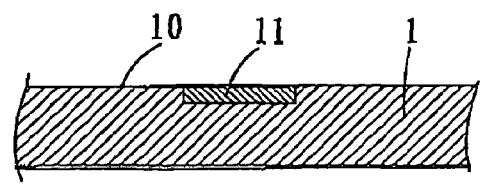
FIGS. 1A to 1F illustrate consecutive steps for forming a first preferred embodiment of a conductive bump on a semiconductor chip according to the method of this invention.
Figure 1B:
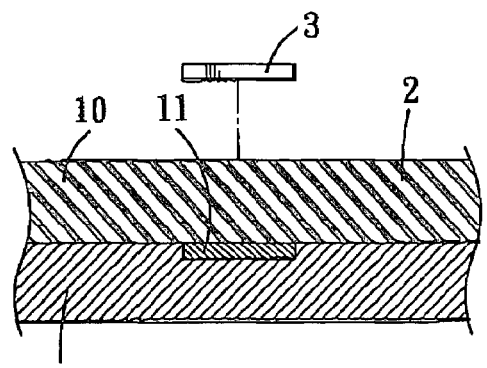
Figure 1C:
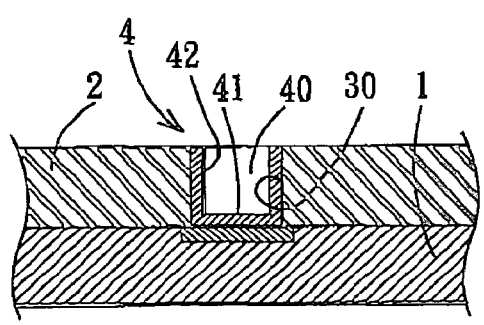
Figure 1D:
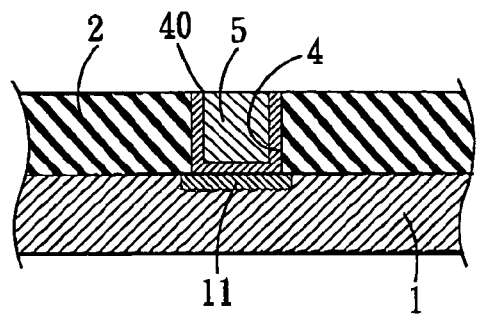
Figure 1E:
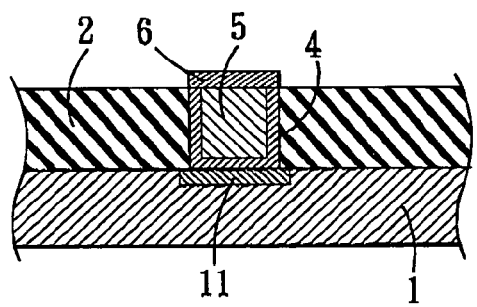

Before the present invention is described in greater detail with reference to the accompanying embodiments, it should be noted that like elements are denoted by the same reference numerals throughout the disclosure.

FIGS. 1A to 1F illustrate consecutive steps of forming a first preferred embodiment of a conductive bump 7 (see FIG. 1F) on a semiconductor chip 1 according to the method of this invention. The semiconductor chip 1 has a pad-mounting surface 10 that is provided with at least a bonding pad 11 (see FIG. 1A). The semiconductor chip 1 can be a die on a wafer or a die cut from the wafer.

The conductive bump 7 includes: a first metal layer 4 bonded to the bonding pad 11; a paste body 5 formed on the first metal layer 4; and a second metal layer 6 formed on the paste body 5 such that the paste body 5 is sandwiched between and is enclosed by the first and second metal layers 4, 6. Note that the paste body 5 can be conductive or non-conductive. In this preferred embodiment, the paste body 5 is conductive.

The first metal layer 4 has a base portion 41 bonded to the bonding pad 11, and a peripheral portion 42 extending from the base portion 41 in a transverse direction relative to the base portion 41 and cooperating with the base portion 41 to confine a recess 40 (see FIG. 1C) therebetween. The paste body 5 fills the recess 40. The second metal layer 6 is connected to the first metal layer 4 and closes the recess 40 so as to enclose the paste body 5 between the first and second metal layers 4, 6.

The method for making the conductive bump 7 includes the steps of: forming a photoresist layer 2 on the pad-mounting surface 10 (see FIG. 1B); patterning the photoresist layer 2 with a mask 3 (see FIG. 1B); etching the photoresist layer 2 to form a through-hole 30 in the photoresist layer 2 so as to expose the bonding pad 11 therefrom (see FIG. 1C); forming the first metal layer 4 on the bonding pad 11 within the through-hole 30 by plating (see FIG. 1C); filling the through-hole 30 with a conductive paste to form the paste body 5 on the first metal layer 4 (see FIG. 1D); forming the second metal layer 6 on the paste body 5 (see FIG. 1E) such that the paste body 5 is sandwiched between and is enclosed by the first and second metal layers 4, 6; and removing the photoresist layer 2 (see FIG. 1F) from the pad-mounting surface 10. The conductive paste employed in the method of this invention is preferably silver paste or silver and carbon paste.

FIGS. 2A to 2F illustrate consecutive steps for forming a second preferred embodiment of the conductive bump 7' (see FIG. 2F) on the bonding pad 11 of the semiconductor chip 1 according to the method of this invention.

Figure 1F:
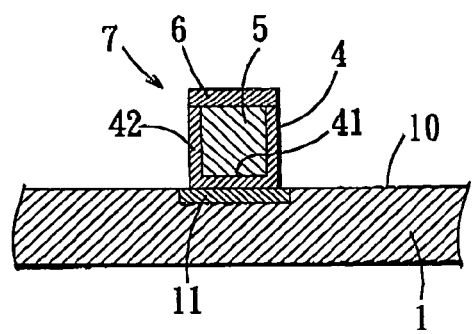
Figure 2A:
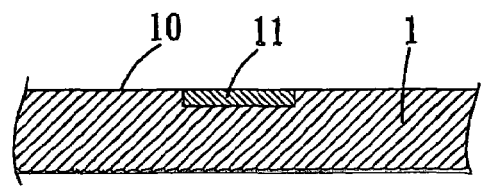
FIGS. 2A to 2F illustrate consecutive steps for forming a second preferred embodiment of the conductive bump on the semiconductor chip according to the method of this invention.
Figure 2B:
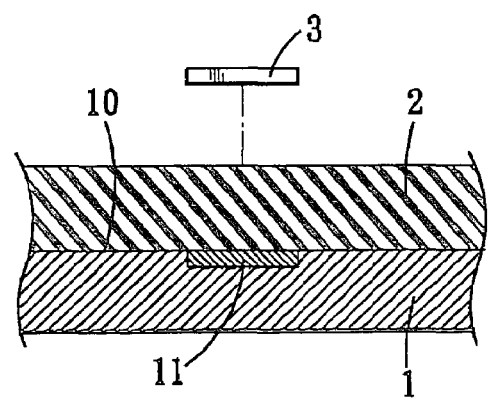
Figure 2C:
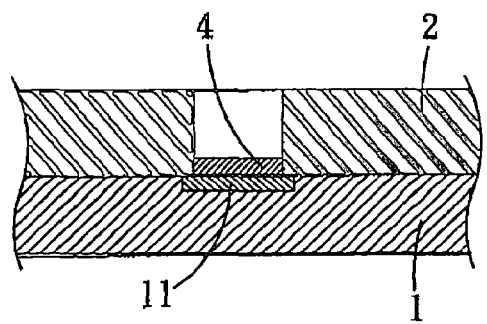
Figure 2D:
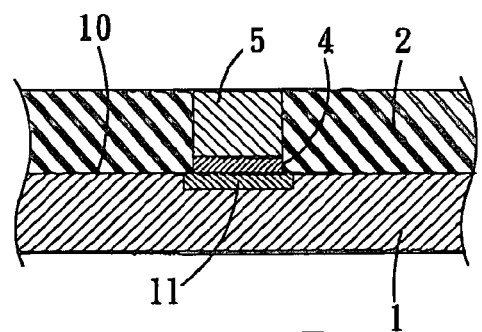
Figure 2E:
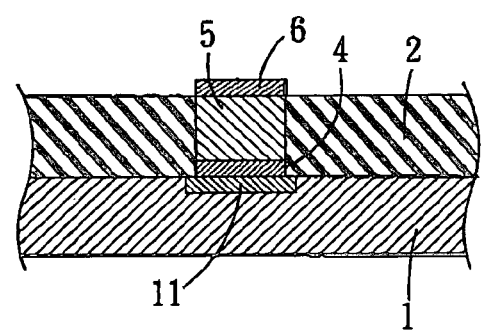
Figure 2F:
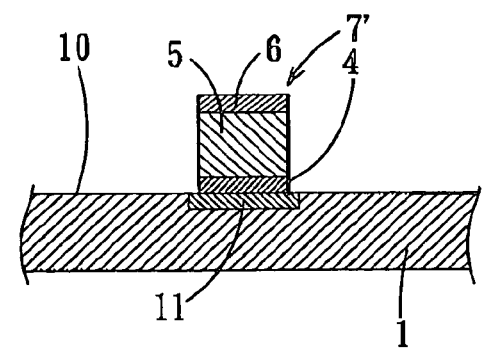

The conductive bump 7' of this embodiment is similar to the previous embodiment shown in FIG. 1F, except that the first metal layer 4 does not include the peripheral portion 42 of the previous embodiment.

With the invention thus explained, it is apparent that various modifications and variations can be made without departing from the spirit of the present invention. It is therefore intended that the invention be limited only as recited in the appended claims.

I claim:

1. A conductive bump for a semiconductor chip that has a pad-mounting surface which is provided with at least a bonding pad thereon, said conductive bump comprising:
    a first metal layer adapted to be bonded to the bonding pad;
    a conductive paste body formed on said first metal layer; and a second metal layer formed on said paste body such that said paste body is sandwiched between said first and second metal layers;

said first metal layer also has a base portion bonded to said bonding pad, and being in contact with said second metal layer through a peripheral portion extending from said base portion in a transverse direction relative to said base portion and cooperating with said base portion to confine a recess therebetween, said conductive paste body filling said recess, said recess being closed by said second metal layer.

2. The conductive bump of claim 1, wherein said conductive paste comprises a thermosetting resin and a conductive filler.

* * * * *